US012771342B2

(12) United States Patent
Sakano et al.

(10) Patent No.: US 12,771,342 B2
(45) Date of Patent: Oct. 20, 2026

(54) SEMICONDUCTOR DRIVE DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsunori Sakano, Tokyo (JP); Tomoko Matsudai, Tokyo (JP); Ryohei Gejo, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 33 days.

(21) Appl. No.: 19/032,528

(22) Filed: Jan. 21, 2025

(65) Prior Publication Data

US 2025/0364988 A1 Nov. 27, 2025

(30) Foreign Application Priority Data

May 23, 2024 (JP) ................................ 2024-083787

(51) Int. Cl.
*H03K 17/567* (2006.01)
*H03K 17/78* (2006.01)

(52) U.S. Cl.
CPC ........... *H03K 17/567* (2013.01); *H03K 17/78* (2013.01)

(58) Field of Classification Search
CPC ............................ H03K 17/567; H03K 17/78
USPC ......................................................... 327/109
See application file for complete search history.

(56) References Cited

U.S. PATENT DOCUMENTS

| | | | | |
|---|---|---|---|---|
| 6,348,781 | B1 * | 2/2002 | Midya | H03F 1/0227 323/283 |
| 2009/0003021 | A1 * | 1/2009 | Tsukamoto | H02M 3/1588 363/74 |
| 2010/0148740 | A1 * | 6/2010 | Saitoh | H02M 3/1582 323/283 |
| 2014/0198873 | A1 * | 7/2014 | Lee | H04L 25/0272 375/285 |
| 2014/0225543 | A1 * | 8/2014 | Maekawa | H02P 27/085 318/400.17 |

(Continued)

FOREIGN PATENT DOCUMENTS

| | | |
|---|---|---|
| JP | 2020078108 A | 5/2020 |
| JP | 2021168543 A | 10/2021 |

*Primary Examiner* — Ryan Jager
(74) *Attorney, Agent, or Firm* — Maier & Maier, PLLC

(57) ABSTRACT

According to one embodiment, a semiconductor drive device includes a circuit section. The circuit section is configured to output a first output signal and a second output signal based on a first sawtooth wave and a second sawtooth wave different from the first sawtooth wave. The first output signal is configured to change from a first potential to a second potential at a first time. The first output signal is configured to change from the second potential to the first potential at a second time. The second output signal is configured to change from a third potential to a fourth potential at the first time. The second output signal is configured to change from the fourth potential to the third potential at a third time. The third time is after the first time and before the second time.

16 Claims, 4 Drawing Sheets

(56) References Cited

U.S. PATENT DOCUMENTS

| | | | | |
|---|---|---|---|---|
| 2014/0321180 | A1* | 10/2014 | Endo | B60L 15/007 363/132 |
| 2016/0380430 | A1* | 12/2016 | Hamada | H02M 3/1584 307/71 |
| 2019/0089274 | A1* | 3/2019 | Maekawa | H02P 6/18 |
| 2020/0144883 | A1 | 5/2020 | Aoki | |
| 2021/0091656 | A1* | 3/2021 | Namekawa | H02M 3/156 |

* cited by examiner

SEMICONDUCTOR DRIVE DEVICE AND SEMICONDUCTOR MODULE

CROSS-REFERENCE TO RELATED APPLICATIONS

This application is based upon and claims the benefit of priority from Japanese Patent Application No. 2024-083787, filed on May 23, 2024; the entire contents of which are incorporated herein by reference.

FIELD

Embodiments described herein relate generally to a semiconductor drive device and semiconductor module.

BACKGROUND

A semiconductor drive device drives a semiconductor device such as a transistor. It is desired to improve the characteristics of semiconductor drive devices.

DETAILED DESCRIPTION

Figure 1A:
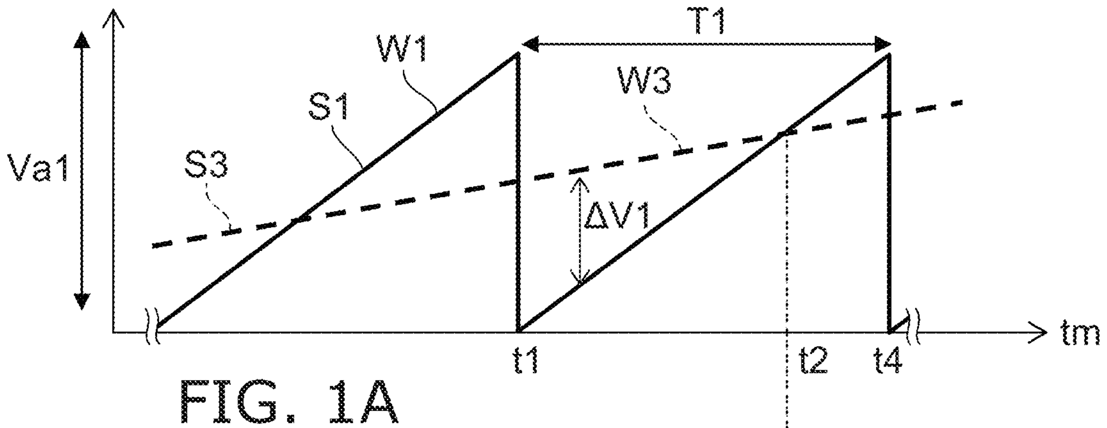
FIGS. 1A to 1D are schematic diagrams illustrating a semiconductor drive device according to a first embodiment.

According to one embodiment, a semiconductor drive device includes a circuit section. The circuit section is configured to output a first output signal and a second output signal based on a first sawtooth wave and a second sawtooth wave different from the first sawtooth wave. The first output signal is configured to change from a first potential to a second potential at a first time. The first output signal is configured to change from the second potential to the first potential at a second time. The second output signal is configured to change from a third potential to a fourth potential at the first time. The second output signal is configured to change from the fourth potential to the third potential at a third time. The third time is after the first time and before the second time.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A to 1D are schematic diagrams illustrating a semiconductor drive device according to a first embodiment.

Figure 2:
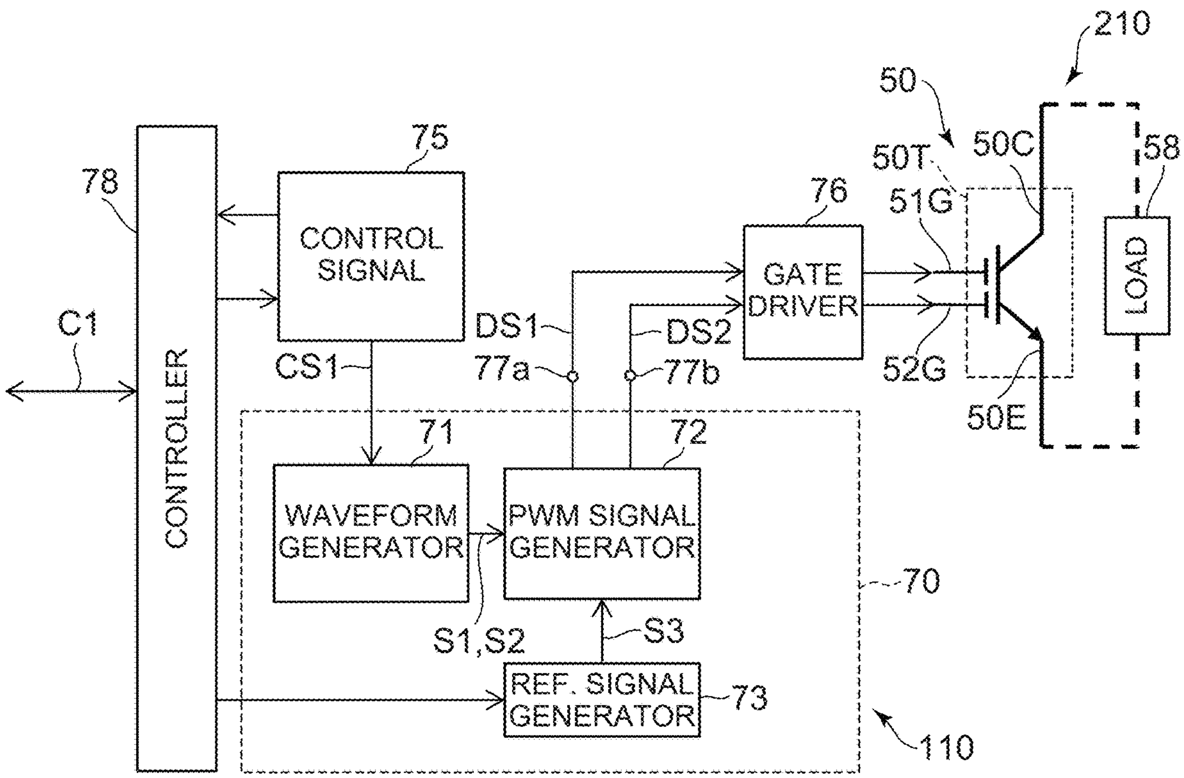
FIG. 2 is a schematic diagram illustrating the semiconductor drive device according to the first embodiment.

FIG. 2 is a schematic diagram illustrating the semiconductor drive device according to the first embodiment.

Figure 3A:
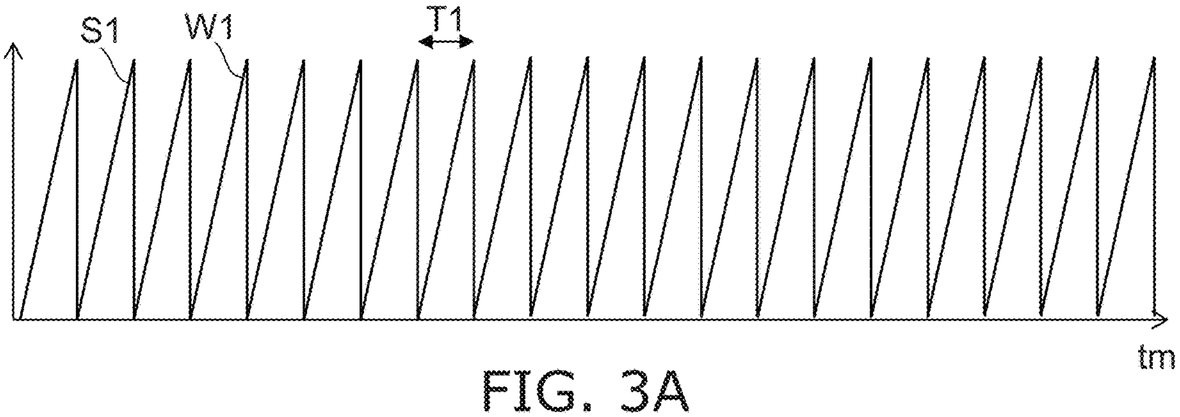
FIGS. 3A to 3C are schematic diagrams illustrating the semiconductor drive device according to the first embodiment.
Figure 3B:
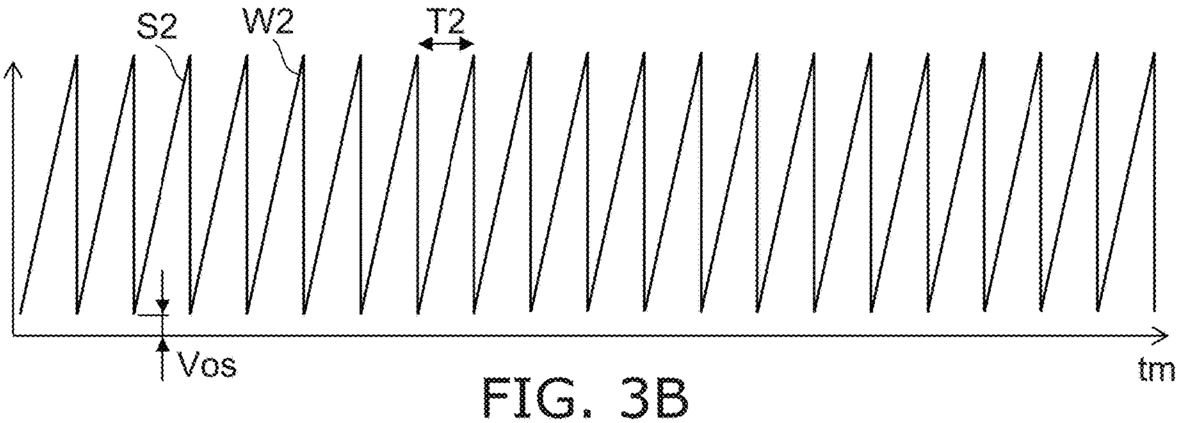
Figure 3C:
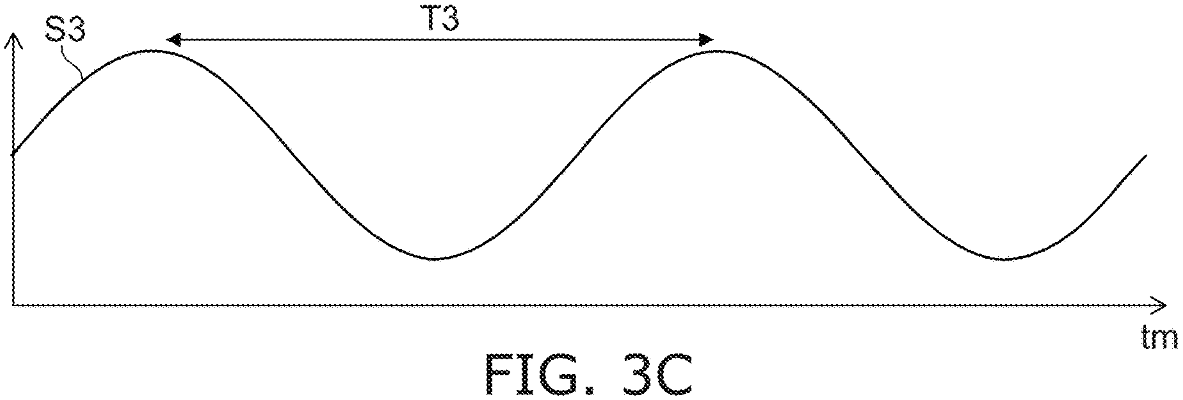

FIGS. 3A to 3C are schematic diagrams illustrating the semiconductor drive device according to the first embodiment.

As shown in FIG. 2, a semiconductor drive device 110 according to the embodiment includes a circuit section (circuitry) 70.

The circuit section 70 is configured to output a first output signal and a second output signal based on the first sawtooth wave and the second sawtooth wave.

Figure 1B:
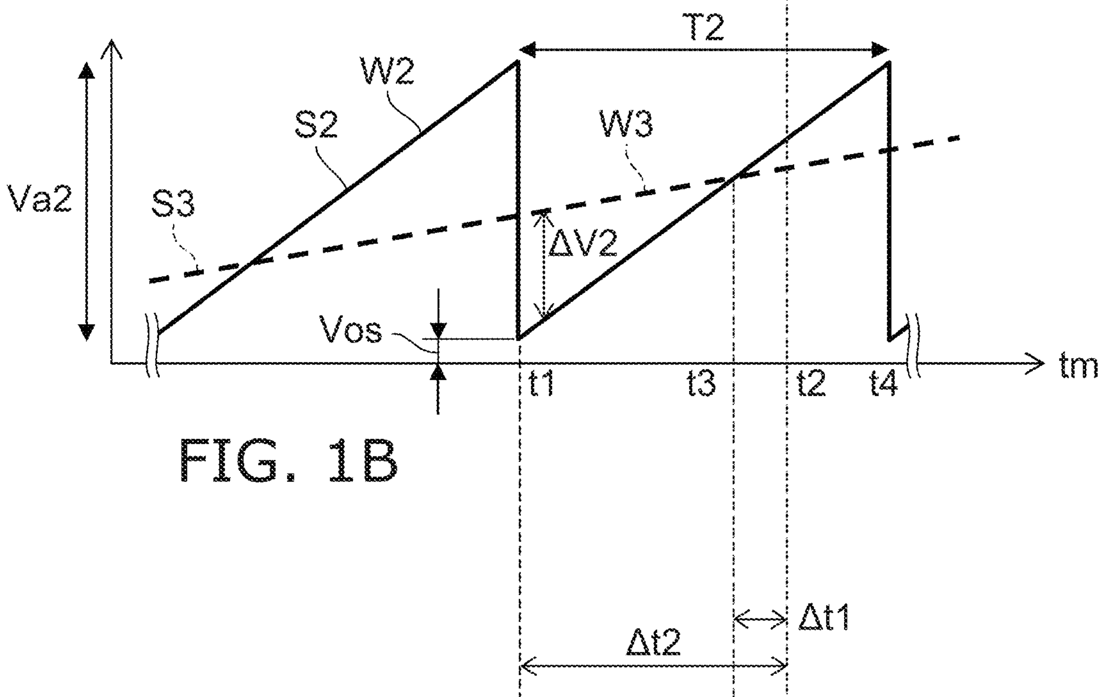
Figure 1C:
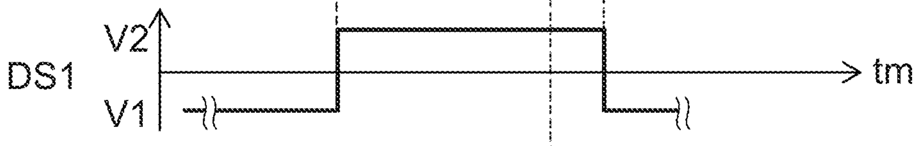
Figure 1D:
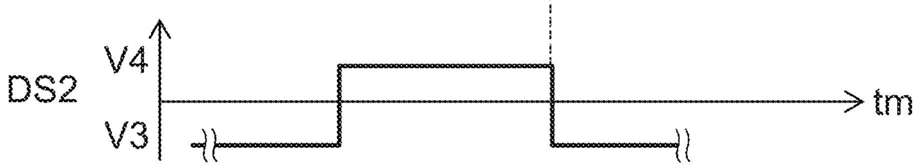

FIG. 1A illustrates the first sawtooth wave W1. FIG. 1B illustrates the second sawtooth wave W2. FIG. 1C illustrates the first output signal DS1. FIG. 1D illustrates the second output signal DS2. The horizontal axis of these figures is time tm.

As shown in FIG. 1C, the first output signal DS1 changes from a first potential V1 to a second potential V2 at a first time t1. The first output signal DS1 changes from the second potential V2 to the first potential V1 at the second time t2.

As shown in FIG. 1D, the second output signal DS2 changes from a third potential V3 to a fourth potential V4 at the first time t1. The second output signal DS2 changes from the fourth potential V4 to the third potential V3 at a third time t3. The third time t3 is after the first time t1 and before the second time t2.

Such a first output signal DS1 and a second output signal DS2 are output from the circuit section 70. As shown in FIG. 2, the circuit section 70 may be configured to supply the first output signal DS1 and the second output signal DS2 to a semiconductor device 50.

For example, the semiconductor device 50 may include a transistor 50T including a first gate 51G and a second gate 52G. For example, one of the first output signal DS1 and the second output signal DS2 is supplied to the first gate 51G. The other of the first output signal DS1 and the second output signal DS2 is supplied to the second gate 52G. The transistor 50T is, for example, an IGBT (Insulated Gate Bipolar Transistor). The transistor 50T is, for example, a multi-gate IGBT. The first gate 51G is, for example, a main gate. The second gate 52G is a control gate. The first gate 51G and the second gate 52G are provided on the same element. The first gate 51G and the second gate 52G are electrically isolated from each other. Mutually independent control signals are input to the first gate 51G and the second gate 52G.

The first output signal DS1 and second output signal DS2 described above are supplied to the semiconductor device 50 (e.g., multi-gate IGBT). The first time t1 corresponds to, for example, a turn-on time. The second time t2 corresponds to, for example, a turn-off time. At a first time t1 during turn-on, the first gate 51G and the second gate 52G are turned on substantially simultaneously. Thereby, turn-on loss can be reduced. On the other hand, during turn-off, the second gate 52G is turned off at the third time t3 before the second time t2 of turn-off of the first gate 51G. Thereby, turn-off loss can be reduced.

The first output signal DS1 and the second output signal DS2 are simultaneous when turned on, and have a time difference when turned off. A first reference example may be considered in which a delay circuit or the like is used to obtain the time difference at turn-off. In the first reference example, one output signal is delayed by a delay circuit. The other output signal is generated from the delayed output signal. In this case, a time difference also occurs during turn-on.

On the other hand, a second reference example can be considered in which a switch circuit and a delay circuit are combined. In the second reference example, the switch circuit switches the operation in which the command signal does not pass through the delay circuit when turned on, and the command signal passes through the delay circuit when turned off. In this case, the command signal is applied to the second gate 52G, and a signal delayed from the command signal is applied to the first gate 51G. Due to the delayed signal from the command signal, a no-response time occurs at turn-off, resulting in losses.

In contrast, in the embodiment, the time difference at turn-off is obtained by two sawtooth waves. As a result, the time difference at turn-off can be obtained without a time difference at turn-on. No need to use a delay circuit. The second output signal DS2 can be turned off at the third time t3 before the command signal is turned off (second time t2). The occurrence of non-reaction time can be suppressed.

In the embodiment, the desired output waveform can be obtained with a simple configuration. According to the embodiment, it is possible to provide a semiconductor drive device with improved characteristics. In the semiconductor device 50 supplied by the semiconductor drive device 110 according to the embodiment, loss can be reduced.

As shown in FIGS. 1C and 1D, a difference between the third time t3 and the second time t2 is defined as a first time difference Δt1. The first time difference Δt1 may be, for example, not less than 1 us and not more than 20 μs. A difference between the first time t1 and the second time t2 is defined as a second time difference Δt2. A ratio of the first time difference Δt1 to the second time difference Δt2 may be, for example, not less than 0.01 and not more than 0.2.

For example, the first potential V1 is lower than the second potential V2. The third potential V3 is lower than the fourth potential V4. The third potential V3 may be substantially the same as the first potential V1. The fourth potential V4 may be substantially the same as the second potential V2. When the first output signal DS1 is at the second potential V2, the semiconductor device 50 is in a conductive state. When the second output signal DS2 is at the fourth potential V4, the semiconductor device 50 is in a conductive state. When the first output signal DS1 is at the first potential V1, and the second output signal DS2 is at the third potential V3, the semiconductor 20 device 50 is in a non-conductive.

In one example, the first potential V1 and the third potential V3 are −15V. The second potential V2 and the fourth potential V4 are +15V.

As shown in FIGS. 1A and 1B, a first bias value of the first sawtooth wave W1 is different from a second bias value of the second sawtooth wave W2. In this example, the first bias value of the first sawtooth wave W1 is substantially zero. The second bias value of the second sawtooth wave W2 is the first potential difference Vos (offset voltage). The first potential difference Vos (offset voltage) is greater than zero. The potential of the second sawtooth wave W2 is higher than the potential of the first sawtooth wave W1. The difference between the potential of the second sawtooth wave W2 and the potential of the first sawtooth wave W1 is the first potential difference Vos.

A first amplitude Va1 of the first sawtooth wave W1 is the same as a second amplitude Va2 of the second sawtooth wave W2. For example, a ratio of the first potential difference Vos between the first bias value and the second bias value to the first amplitude Va1 of the first sawtooth wave W1 may be, for example, not less than 0.1 and not more than 10.

A first period T1 of the first sawtooth wave W1 is substantially the same as a second period T2 of the second sawtooth wave W2. A first phase of the first sawtooth wave W1 is substantially the same as a second phase of the second sawtooth wave W2. A rising timing of the first sawtooth wave W1 substantially coincides with a rising timing of the second sawtooth wave W2.

As shown in FIG. 1A, the circuit section 70 may be configured to output the first output signal DS1 based on a first difference ΔV1 between a third wave W3 that change with time and the first sawtooth wave W1. As shown in FIG. 1B, the circuit section 70 may be configured to output the second output signal DS2 based on a second difference ΔV2 between the third wave W3 and the second sawtooth wave W2.

FIG. 3A illustrates the first sawtooth wave W1. FIG. 3B illustrates the second sawtooth wave W2. FIG. 3C illustrates a third signal S3. FIGS. 3A to 3C illustrate a period longer than that illustrated in FIGS. 1A and 1B.

As shown in FIG. 3C, the third wave W3 may include, for example, a sine wave. A third period T3 of the sine wave is longer than the first period T1 of the first sawtooth wave W1. The third period T3 is longer than the second period T2 of the second sawtooth wave W2.

An amplitude of the third wave W3 is, for example, smaller than the first amplitude Va1. The amplitude of the third wave W3 is, for example, smaller than the second amplitude Va2. For example, the maximum value of the potential of the third wave W3 is lower than the maximum value of the first sawtooth wave W1. The maximum value of the potential of the third wave W3 is, for example, lower than the maximum value of the first sawtooth wave W1. For example, the minimum value of the potential of the third wave W3 is higher than the minimum value of the first sawtooth wave W1. For example, the minimum value of the potential of the third wave W3 is higher than the minimum value of the second sawtooth wave W2. The third wave W3 crosses the first sawtooth wave W1 and the second sawtooth wave W2. For example, the third wave W3 crosses the first sawtooth wave W1 and the second sawtooth wave W2 twice during the first period T1.

For example, the time when the value of the first sawtooth wave W1 transitions from a state smaller than the value of the third wave W3 to a larger state corresponds to the second time t2. The time when the value of the second sawtooth wave W2 transitions from a state smaller than the value of the third wave W3 to a state larger than the value corresponds to the third time t3. Since an offset is provided between the first sawtooth wave W1 and the second sawtooth wave W2, the third time t3 is shifted with respect to the second time t2.

As shown in FIG. 1A, the value of the first sawtooth wave W1 increases during the period from the first time t1 to the fourth time t4. The fourth time t4 is after the second time t2. At the first time t1 (or the fourth time t4), the value of the first sawtooth wave W1 decreases. The absolute value of the slope of the decrease in the value of the first sawtooth wave W1 is greater than the absolute value of the slope of the increase in the value of the first sawtooth wave W1.

As shown in FIG. 1B, the value of the second sawtooth wave W2 increases during the period from the first time t1 to the fourth time t4. At the first time t1 (or the fourth time t4), the value of the second sawtooth wave W2 decreases. The absolute value of the slope of the decrease in the value of the second sawtooth wave W2 is greater than the absolute value of the slope of the increase in the value of the second sawtooth wave W2.

The first period T1 and the second period T2 correspond to the time from the first time t1 to the fourth time t4.

As shown in FIG. 2, the circuit section 70 may include a first circuit 71 and a second circuit 72. The first circuit 71 is configured to output a first sawtooth signal S1 of the first sawtooth wave W1 and a second sawtooth signal S2 of the second sawtooth wave W2. The first sawtooth signal S1 and the second sawtooth signal S2 are, for example, carrier signals. The first circuit 71 may be, for example, a carrier signal generation section. The first circuit 71 may be, for example, a sawtooth waveform generator. The first circuit 71 is configured to simultaneously output the first sawtooth signal S1 and the second sawtooth signal S2.

The second circuit 72 is configured to output the first output signal DS1 and the second output signal DS2 based on the first sawtooth signal S1 and the second sawtooth signal S2. For example, the second circuit 72 may be a PWM signal generator.

The circuit section 70 may further include a third circuit 73. The third circuit 73 is configured to output a third signal S3 that changes with time. The third signal S3 corresponds to the third wave W3.

The second circuit 72 is configured to output the first output signal DS1 based on the first difference ΔV1 (see FIG. 1A) between the third signal S3 and the first sawtooth signal S1. The second circuit 72 is configured to output the second output signal DS2 based on the second difference ΔV2 (see FIG. 1B) between the third signal S3 and the second sawtooth signal S2. The second circuit 72 may include, for example, a comparator.

The second circuit 72 may include a comparator that receives the third signal S3 and the first sawtooth signal S1. When the potential of the first sawtooth signal S1 is higher than the potential of the third signal S3, the first output signal DS1 is at the first potential V1. When the potential of the third signal S3 is higher than the potential of the first sawtooth signal S1, the first output signal DS1 is at the second potential V2. The second circuit 72 may include a comparator that receives the third signal S3 and the second sawtooth signal S2. When the potential of the second sawtooth signal S2 is higher than the potential of the third signal S3, the second output signal DS2 is at the third potential V3. When the potential of the third signal S3 is higher than the potential of the second sawtooth signal S2, the second output signal DS2 is at the fourth potential V4.

As shown in FIG. 3C, the third signal S3 may include, for example, a sine wave. The third circuit 73 may be, for example, a sine wave generator. The third period T3 of the sine wave is longer than the first period T1 and longer than the second period T2. The third circuit 73 may be, for example, a reference signal generation section.

As shown in FIG. 2, the circuit section 70 may include a first terminal **77*a* and a second terminal 77*b*. The first terminal 77*a* may be configured to output the first output signal DS1. The second terminal 77*b* may be configured to output the second output signal DS2. In the embodiment, the first terminal 77*a* may be configured to output one of the first output signal DS1 and the second output signal DS2. The second terminal 77*b*** may be configured to output the other of the first output signal DS1 and the second output signal DS2.

As shown in FIG. 2, a gate drive circuit 76 may be provided. The gate drive circuit 76 may be included in the circuit section 70. The gate drive circuit 76 may be provided separately from the circuit section 70. The gate drive circuit 76 may be included in semiconductor drive device 110. The gate drive circuit 76 may be provided separately from the semiconductor drive device 110.

The gate drive circuit 76 is configured to supply one of the first output signal DS1 and the second output signal DS2 to the first gate 51G. The gate drive circuit 76 is configured to supply the other of the first output signal DS1 and the second output signal DS2 to the second gate 52G. The gate drive circuit 76 may include a photo-coupler. The high-power semiconductor device 50 and the semiconductor drive device 110 are well electrically isolated.

As shown in FIG. 2, a fifth circuit 75 may be provided. The fifth circuit 75 may be included in the circuit section 70. The fifth circuit 75 may be provided separately from the circuit section 70. The fifth circuit 75 may be included in the semiconductor drive device 110. The fifth circuit 75 may be provided separately from the semiconductor drive device 110.

The fifth circuit 75 is configured to output a control signal CS1. The control signal CS1 is used to control the first phase, the second phase, the first bias value, and the second bias value. The control signal CS1 is supplied to the first circuit 71. In the first circuit 71, the first sawtooth signal S1 and the second sawtooth signal S2 may be generated based on the control signal CS1. The fifth circuit 75 is, for example, a control signal generation section.

For example, the controller 78 is configured to control the fifth circuit 75 and the third circuit 73 based on a command C1 (for example, a command signal) supplied from the outside. The controller 78 may be provided separately from the circuit section 70. The controller 78 may be included in semiconductor drive device 110. The controller 78 may be provided separately from the semiconductor drive device 110.

Figure 4:
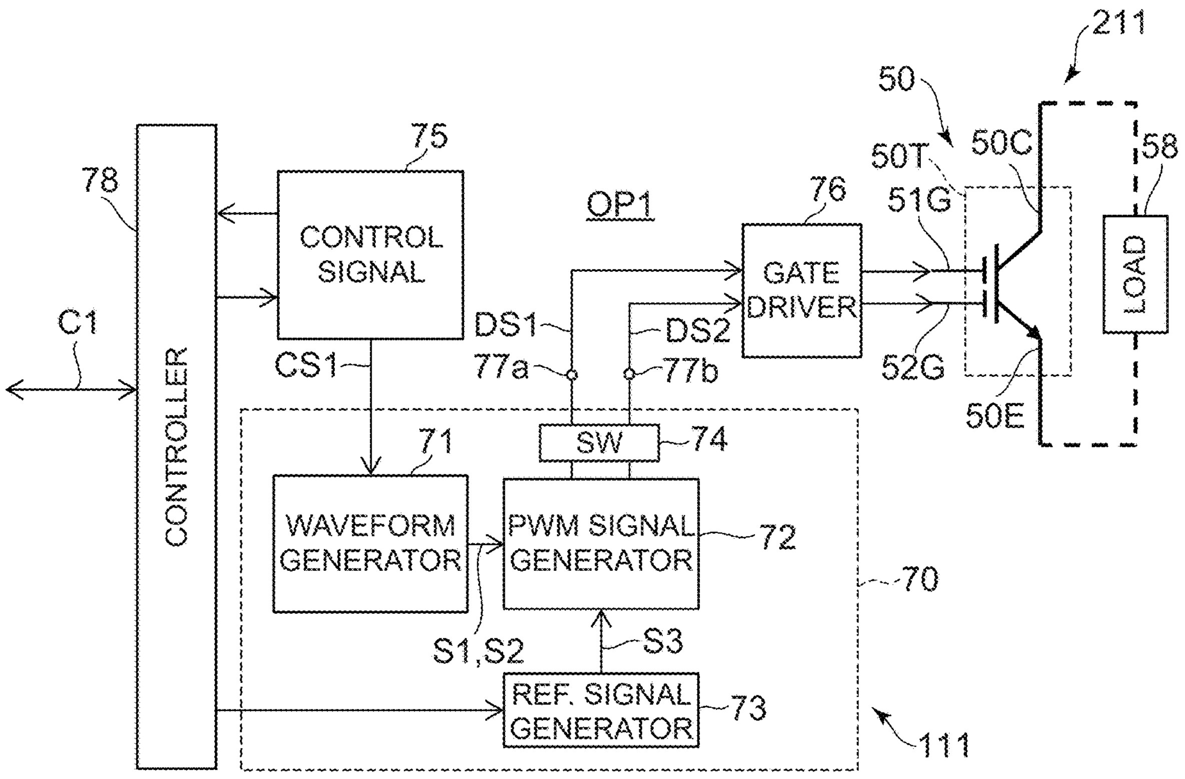
FIG. 4 is a schematic diagram illustrating a semiconductor drive device according to the first embodiment.
Figure 5:
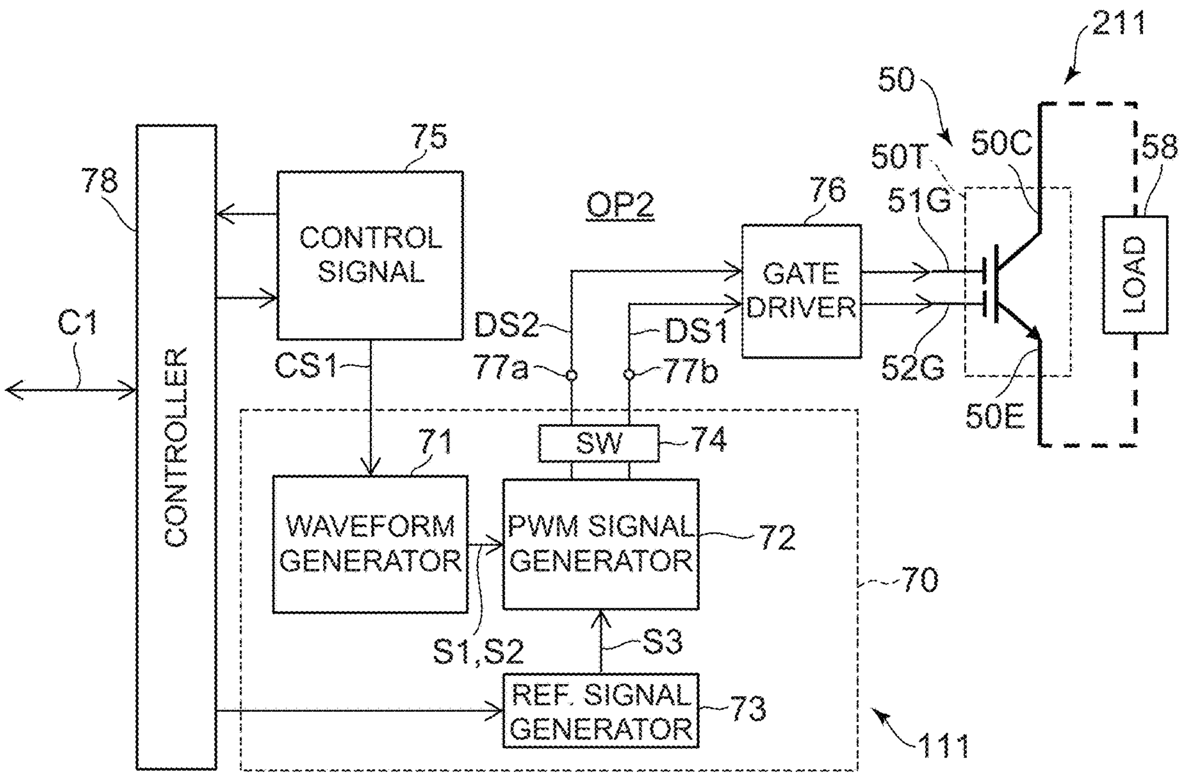
FIG. 5 is a schematic diagram illustrating a semiconductor drive device according to the first embodiment.

FIGS. 4 and 5 are schematic diagrams illustrating a semiconductor drive device according to the first embodiment.

As shown in FIGS. 4 and 5, in a semiconductor drive device 111 according to the embodiment, the circuit section 70 further includes a fourth circuit 74. The configuration of the semiconductor drive device 111 except for this may be the same as the configuration of the semiconductor drive device 110.

The fourth circuit 74 may perform the first operation OP1 and the second operation OP2. FIG. 4 corresponds to the first operation OP1. FIG. 5 corresponds to the second operation OP2.

As already explained, the circuit section 70 may include the first terminal **77*a* and the second terminal 77*b*. As shown in FIG. 4, in the first operation OP1, the first terminal 77*a* is configured to output the first output signal DS1. In the first operation OP1, the second terminal 77*b* is configured to output the second output signal DS2. As shown in FIG. 5, in the second operation OP2, the first terminal 77*a* is configured to output the second output signal DS2. In the second operation OP2, the second terminal 77*b*** is configured to output the first output signal DS1.

In the first operation OP1, the first output signal DS1 is supplied to the first gate 51G, and the second output signal DS2 is supplied to the second gate 52G. In the second operation OP2, the first output signal DS1 is supplied to the second gate 52G, and the second output signal DS2 is supplied to the first gate 51G. The operation of the main gate and the operation of the control gate are performed interchangeably. For example, more stable operation can be obtained.

The fourth circuit 74 is configured to switch between the first operation OP1 and the second operation OP2. The fourth circuit 74 is, for example, a switch section.

Second Embodiment

The semiconductor module 210 (see FIG. 2) according to the second embodiment includes the semiconductor drive device 110 according to the first embodiment and the semiconductor device 50. A semiconductor module 211 according to the second embodiment (see FIGS. 4 and 5) includes the semiconductor drive device 111 according to the first embodiment and the semiconductor device 50.

In the semiconductor module 210 and the semiconductor module 211, the circuit section 70 may perform the operations described in relation to the first embodiment. For example, the circuit section 70 is configured to supply the first output signal DS1 and the second output signal DS2 to the semiconductor device 50. The semiconductor device 50 includes the transistor 50T. The transistor 50T includes the first gate 51G and the second gate 52G. One of the first output signal DS1 and the second output signal DS2 is supplied to the first gate 51G. The other of the first output signal DS1 and the second output signal DS2 is supplied to the second gate 52G.

The transistor 50T is, for example, an IGBT. Turn-on loss and turn-off loss can be reduced. The transistor 50T further includes, for example, an emitter 50E and a collector 50C. The emitter 50E and collector 50C are connected to a target device 58. The target device 58 is, for example, a load.

The embodiments may include the following Technical proposals:

(Technical Proposal 1)

A semiconductor drive device, comprising:

a circuit section, the circuit section being configured to output a first output signal and a second output signal based on a first sawtooth wave and a second sawtooth wave different from the first sawtooth wave;

the first output signal being configured to change from a first potential to a second potential at a first time, the first output signal being configured to change from the second potential to the first potential at a second time, the second output signal being configured to change from a third potential to a fourth potential at the first time, the second output signal being configured to change from the fourth potential to the third potential at a third time, and the third time being after the first time and before the second time.

(Technical Proposal 2)

The semiconductor drive device according to Technical proposal 1, wherein a first bias value of the first sawtooth wave is different from a second bias value of the second sawtooth wave.

(Technical Proposal 3)

The semiconductor drive device according to Technical proposal 2, wherein a first period of the first sawtooth wave is substantially the same as a second period of the second sawtooth wave, and a first phase of the first sawtooth wave is substantially the same as a second phase of the second sawtooth wave.

(Technical Proposal 4)

The semiconductor drive device according to Technical proposal 3, wherein the circuit section is configured to output the first output signal based on a first difference between a third wave that changes with time, and the first sawtooth wave, and the circuit section is configured to output the second output signal based on a second difference between the third wave and the second sawtooth wave.

(Technical Proposal 5)

The semiconductor drive device according to Technical proposal 4, wherein the third wave includes a sine wave, and a third period of the sine wave is longer than the first period and longer than the second period.

(Technical Proposal 6)

The semiconductor drive device according to Technical proposal 3, wherein the circuit section includes a first circuit and a second circuit, the first circuit is configured to output a first sawtooth signal of the first sawtooth wave and a second sawtooth signal of the second sawtooth wave, and the second circuit is configured to output the first output signal and the second output signal based on the first sawtooth signal and the second sawtooth signal.

(Technical Proposal 7)

The semiconductor drive device according to Technical proposal 6, wherein the circuit section further includes a third circuit, the third circuit is configured to output a third signal that changes with time, the second circuit is configured to output the first output signal based on a first difference between the third signal and the first sawtooth signal, and the second circuit is configured to output the second output signal based on a second difference between the third signal and the second sawtooth signal.

(Technical Proposal 8)

The semiconductor drive device according to Technical proposal 7, wherein the third signal includes a sine wave, and a third period of the sine wave is longer than the first period and longer than the second period.

(Technical Proposal 9)

The semiconductor drive device according to any one of Technical proposals 3-8, wherein a ratio of a first potential difference between the first bias value and the second bias value to a first amplitude of the first sawtooth wave is not less than 0.1 and not more than 10.

(Technical Proposal 10)

The semiconductor drive device according to any one of Technical proposals 3-9, wherein the circuit section further includes a fifth circuit, the fifth circuit is configured to output a control signal for controlling the first phase, the second phase, the first bias value, and the second bias value.

(Technical Proposal 11)

The semiconductor drive device according to Technical proposal 7, wherein when a potential of the first sawtooth signal is higher than a potential of the third signal, the first output signal is at the first potential, when the potential of the third signal is higher than the potential of the first sawtooth signal, the potential is the second potential, when the potential of the second sawtooth signal is higher than the potential of the third signal, the second output signal is at the third potential, when the potential of the third signal is higher than the potential of the second sawtooth signal, the second output signal is at the fourth potential, the second potential is higher than the first potential, and the fourth potential is higher than the third potential.

(Technical Proposal 12)

The semiconductor drive device according to Technical proposal 7, wherein a potential of the second sawtooth signal is higher than a potential of the first sawtooth signal, a maximum value of the third signal is lower than a maximum value of the first sawtooth signal, and a minimum value of the third signal is higher than a minimum value of the second sawtooth signal.

(Technical Proposal 13)

The semiconductor drive device according to any one of Technical proposals 1-11, wherein the circuit section includes a first terminal and a second terminal, In a first operation, the first terminal is configured to output the first output signal, and the second terminal is configured to output the second output signal, and in a second operation, the first terminal is configured to output the second output signal, and the second terminal is configured to output the first output signal.

(Technical Proposal 14)

The semiconductor drive device according to Technical proposal 13, wherein the circuit section further includes a fourth circuit, and the fourth circuit is configured to switch between the first operation and the second operation.

(Technical Proposal 15)

The semiconductor drive device according to any one of Technical proposals 1-14, wherein the circuit section is configured to supply the first output signal and the second output signal to a semiconductor device, the semiconductor device includes a transistor including a first gate and a second gate, one of the first output signal and the second output signal is supplied to the first gate, and another of the first output signal and the second output signal is supplied to the second gate.

(Technical Proposal 16)

The semiconductor drive device according to Technical proposal 15, wherein the transistor is an IGBT (Insulated Gate Bipolar Transistor).

(Technical Proposal 17)

The semiconductor drive device according to Technical proposal 15 or 16, wherein the circuit section further includes a gate drive circuit, the gate drive circuit is configured to supply the one of the first output signal and the second output signal to the first gate, and the gate drive circuit is configured to supply the other of the first output signal and the second output signal to the second gate.

(Technical Proposal 18)

The semiconductor drive device according to Technical proposal 17, wherein the gate drive circuit includes a photo-coupler.

(Technical Proposal 19)

A semiconductor module, comprising:

the semiconductor drive device according to any one of Technical proposals 1-14; and a semiconductor device, the circuit section is configured to supply the first output signal and the second output signal to the semiconductor device, the semiconductor device includes a transistor including a first gate and a second gate, one of the first output signal and the second output signal is supplied to the first gate, and other of the first output signal and the second output signal is supplied to the second gate.

(Technical Proposal 20)

The semiconductor module according to Technical proposal 19, wherein the transistor is an IGBT (Insulated Gate Bipolar Transistor).

According to the embodiment, a semiconductor drive device and a semiconductor module with improved characteristics are provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the semiconductor drive devices and the semiconductor modules such as circuit sections, circuits, semiconductor devices, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor drive devices and all semiconductor modules practicable by an appropriate design modification by one skilled in the art based on the semiconductor drive devices and the semiconductor modules described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor drive device, comprising:

a circuit section, the circuit section being configured to output a first output signal and a second output signal based on a first sawtooth wave and a second sawtooth wave different from the first sawtooth wave;

the first output signal being configured to change from a first potential to a second potential at a first time, the first output signal being configured to change from the second potential to the first potential at a second time, the second output signal being configured to change from a third potential to a fourth potential at the first time, the second output signal being configured to change from the fourth potential to the third potential at a third time, and the third time being after the first time and before the second time, wherein a first bias value of the first sawtooth wave is different from a second bias value of the second sawtooth wave, a first period of the first sawtooth wave is substantially the same as a second period of the second sawtooth wave, a first phase of the first sawtooth wave is substantially the same as a second phase of the second sawtooth wave, the circuit section is configured to output the first output signal based on a first difference between a third wave that changes with time, and the first sawtooth wave, the circuit section is configured to output the second output signal based on a second difference between the third wave and the second sawtooth wave, the third wave includes a sine wave, and a third period of the sine wave is longer than the first period and longer than the second period.

2. The semiconductor drive device according to claim 1, wherein the circuit section includes a first circuit and a second circuit, the first circuit is configured to output a first sawtooth signal of the first sawtooth wave and a second sawtooth signal of the second sawtooth wave, and the second circuit is configured to output the first output signal and the second output signal based on the first sawtooth signal and the second sawtooth signal.

3. The semiconductor drive device according to claim 2, wherein the circuit section further includes a third circuit, the third circuit is configured to output a third signal that changes with time, the second circuit is configured to output the first output signal based on a first difference between the third signal and the first sawtooth signal, and the second circuit is configured to output the second output signal based on a second difference between the third signal and the second sawtooth signal.

4. The semiconductor drive device according to claim 3, wherein the third signal includes a sine wave, and a third period of the sine wave is longer than the first period and longer than the second period.

5. The semiconductor drive device according to claim 3, wherein when a potential of the first sawtooth signal is higher than a potential of the third signal, the first output signal is at the first potential, when the potential of the third signal is higher than the potential of the first sawtooth signal, the potential is the second potential, when the potential of the second sawtooth signal is higher than the potential of the third signal, the second output signal is at the third potential, when the potential of the third signal is higher than the potential of the second sawtooth signal, the second output signal is at the fourth potential, the second potential is higher than the first potential, and the fourth potential is higher than the third potential.

6. The semiconductor drive device according to claim 3, wherein a potential of the second sawtooth signal is higher than a potential of the first sawtooth signal, a maximum value of the third signal is lower than a maximum value of the first sawtooth signal, and a minimum value of the third signal is higher than a minimum value of the second sawtooth signal.

7. The semiconductor drive device according to claim 1, wherein a ratio of a first potential difference between the first bias value and the second bias value to a first amplitude of the first sawtooth wave is not less than 0.1 and not more than 10.

8. The semiconductor drive device according to claim 1, wherein the circuit section further includes a fifth circuit, the fifth circuit is configured to output a control signal for controlling the first phase, the second phase, the first bias value, and the second bias value.

9. A semiconductor module, comprising:

the semiconductor drive device according to claim 1; and a semiconductor device, the circuit section is configured to supply the first output signal and the second output signal to the semiconductor device, the semiconductor device includes a transistor including a first gate and a second gate, one of the first output signal and the second output signal is supplied to the first gate, and other of the first output signal and the second output signal is supplied to the second gate.

10. The semiconductor module according to claim 9, wherein the transistor is an IGBT (Insulated Gate Bipolar Transistor).

11. A semiconductor drive device, comprising:

a circuit section, the circuit section being configured to output a first output signal and a second output signal based on a first sawtooth wave and a second sawtooth wave different from the first sawtooth wave;

the first output signal being configured to change from a first potential to a second potential at a first time, the first output signal being configured to change from the second potential to the first potential at a second time, the second output signal being configured to change from a third potential to a fourth potential at the first time, the second output signal being configured to change from the fourth potential to the third potential at a third time, and the third time being after the first time and before the second time, wherein the circuit section includes a first terminal and a second terminal, In a first operation, the first terminal is configured to output the first output signal, and the second terminal is configured to output the second output signal, and in a second operation, the first terminal is configured to output the second output signal, and the second terminal is configured to output the first output signal.

12. The semiconductor drive device according to claim 11, wherein the circuit section further includes a fourth circuit, and the fourth circuit is configured to switch between the first operation and the second operation.

13. A semiconductor drive device, comprising:

a circuit section, the circuit section being configured to output a first output signal and a second output signal based on a first sawtooth wave and a second sawtooth wave different from the first sawtooth wave;

the first output signal being configured to change from a first potential to a second potential at a first time, the first output signal being configured to change from the second potential to the first potential at a second time, the second output signal being configured to change from a third potential to a fourth potential at the first time, the second output signal being configured to change from the fourth potential to the third potential at a third time, and the third time being after the first time and before the second time, wherein the circuit section is configured to supply the first output signal and the second output signal to a semiconductor device, the semiconductor device includes a transistor including a first gate and a second gate, one of the first output signal and the second output signal is supplied to the first gate, and another of the first output signal and the second output signal is supplied to the second gate.

14. The semiconductor drive device according to claim 13, wherein the transistor is an IGBT (Insulated Gate Bipolar Transistor).

15. The semiconductor drive device according to claim 13, wherein the circuit section further includes a gate drive circuit, the gate drive circuit is configured to supply the one of the first output signal and the second output signal to the first gate, and the gate drive circuit is configured to supply the other of the first output signal and the second output signal to the second gate.

16. The semiconductor drive device according to claim 15, wherein the gate drive circuit includes a photo-coupler.

* * * * *